(12) United States Patent
Wang et al.

(10) Patent No.: US 6,445,070 B1
(45) Date of Patent: Sep. 3, 2002

(54) COHERENT CARBIDE DIFFUSION BARRIER FOR INTEGRATED CIRCUIT INTERCONNECTS

(75) Inventors: Pin-Chin Connie Wang, Menlo Park; Amit P. Marathe, Milpitas; Minh Van Ngo, Fremont; Suzette K. Prangrle, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/772,715

(22) Filed: Jan. 29, 2001

Related U.S. Application Data

(60) Provisional application No. 60/256,415, filed on Dec. 18, 2000.

(51) Int. Cl.$^7$ .......................... H01L 23/48; H01L 23/52; H01L 29/40
(52) U.S. Cl. ........................ 257/751; 257/759; 257/762; 257/763; 438/623; 438/687
(58) Field of Search ................... 257/751, 752, 257/753, 759, 761, 762, 763, 764, 767, 771; 438/687, 643, 623

(56) References Cited

U.S. PATENT DOCUMENTS

| | | | |
|---|---|---|---|
| 5,861,677 A | * | 1/1999 | You et al. .................... 257/783 |
| 6,077,774 A | * | 6/2000 | Hong et al. ................. 438/643 |
| 6,090,710 A | * | 7/2000 | Andricacos et al. ........ 438/687 |

* cited by examiner

*Primary Examiner*—Olik Chaudhuri
*Assistant Examiner*—Erik Kielin
(74) *Attorney, Agent, or Firm*—Mikio Ishimaru

(57) ABSTRACT

An integrated circuit and manufacturing method therefore is provided having a semiconductor substrate with a semiconductor device and a device dielectric layer formed on the semiconductor substrate. A channel dielectric layer on the device dielectric layer has a channel opening, a barrier layer lining the channel opening, and a conductor core filling the channel opening. A barrier layer is deposited which contains an element capable of reacting during thermal treatment with both the conductor core and the channel dielectric layer to form a barrier to diffusion of the material of the conductor core to the channel dielectric layer. The barrier layer reacts with the conductor core and the channel dielectric layer to form a compound which provides a bond which blocks surface diffusion and permits conductor core to conductor core diffusion in dual inlaid integrated circuits.

27 Claims, 2 Drawing Sheets

COHERENT CARBIDE DIFFUSION BARRIER FOR INTEGRATED CIRCUIT INTERCONNECTS

CROSS-REFERENCE TO RELATED APPLICATION(S)

This application claims the benefit of U.S. Provisional Patent Application Serial No. 60/256,415 filed Dec. 18, 2000.

The present application also contains subject matter related to a concurrently filed U.S. Patent Application by Pin-Chin Connie Wang, Amit P. Marathe, Minl Van Ngo, and Suzette K. Pangrle entitled "COHERENT ALLOY DIFFUSION BARRIER FOR INTEGRATED CIRCUIT INTERCONNECTS" and identified by docket number F0309.

TECHNICAL FIELD

The present invention relates generally to semiconductors and more specifically to diffusion barrier in semiconductor processing.

BACKGROUND ART

In the manufacture of integrated circuits, after the individual devices, such as the transistors, have been fabricated in the silicon substrate, they must be connected together to perform the desired circuit functions. This interconnection process is generally called "revitalization", and is performed using a number of different photolithographic and deposition techniques.

In one interconnection process, which is called a "single inlaid" technique, channels of conductor material are deposited in a channel dielectric layer. The process starts with the placement of a first channel dielectric layer, which is typically an oxide layer, over the semiconductor devices. A first inlaid step photoresist is then placed over the oxide layer and is photolithographically processed to form the pattern of the first channels. An anisotropic oxide etch is then used to etch out the channel oxide layer to form the first channel openings. The inlaid step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductor material and to act as a barrier material to prevent diffusion of such conductor material into the oxide layer and the semiconductor devices. A first conductor material is then deposited and subjected to a chemical-mechanical polishing process which removes the first conductor material above the first channel oxide layer and inlays the first conductor material in the first channel openings to form the first channels.

In another interconnection process, which is called a "dual inlaid" technique, vias and channels are formed at the same time. The via formation step of the dual inlaid process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second inlaid step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The inlaid photoresist is then removed, and a nitride etch process removes the nitride above the first channels in the via areas. An adhesion layer is often deposited to coat the via openings and the second channel openings. Next, a barrier layer is deposited on the adhesion layer, and the two layers are collectively referred to as the barrier layer. This is followed by a deposition of the second conductor material in the second channel openings and the via openings to form the second channel and the via. A second chemical mechanical polishing process leaves the two vertically separated, horizontally perpendicular channels connected by vias.

The use of the single and dual inlaid techniques eliminate metal etch and dielectric gap fill steps typically used in the metallization process. The elimination of metal etch steps is important as the semiconductor industry moves from aluminum to other metallization materials, such as copper, which are very difficult to etch.

One drawback of using copper as the conductor material is that copper diffuses rapidly through various materials. Unlike aluminum, copper also diffuses through inter layer dielectric materials, such as silicon oxide. When copper diffuses through interlayer dielectric layers, it can cause leakage to neighboring interconnect lines on the semiconductor substrate. To prevent diffusion, highly diffusion resistive barrier materials, such as tantalum, titanium, tungsten, their nitrides, and combinations thereof, are used as barrier materials.

After deposition of the barrier layer, a seed layer of conductor material, such as copper, is deposited by an ion metal plasma (IMP) deposition, chemical vapor deposition (CVD), or an electroless plating process. This seed layer is subsequently used as one electrode in an electroplating process which deposits the conductor material which completely fills the channels and vias.

One problem is that current barrier materials typically are very high in resistance, which will defeat the purpose of using high conductivity materials, such as copper, which is desirable for high speed and good interconnections.

Another problem with current barrier materials is that the interface between barrier and the conductor material is not very strong, and this permits electromigration (EM) of conductor material to occur which results in void formation and reliability problems.

A solution to these problems has been long sought but has eluded those skilled in the art.

DISCLOSURE OF THE INVENTION

The present invention provides an integrated circuit having a semiconductor substrate with a semiconductor device and a device dielectric layer formed on the semiconductor substrate. A channel dielectric layer on the device dielectric layer has a channel opening, a barrier layer lining the channel opening, and a conductor core filling the channel opening. The barrier layer contains an element reacting with both the channel dielectric layer and the conductor core whereby the barrier layer forms a coherent barrier to diffusion of the material of the conductor core to the channel dielectric layer. The coherent barrier provides a bond which blocks surface diffusion and permits conductor core to conductor core diffusion. This also causes the barrier layer to be self-aligning in the channel opening.

The present invention further provides a method for manufacturing an integrated circuit having a semiconductor substrate with a semiconductor device. A device dielectric layer is formed on the semiconductor substrate and a channel dielectric layer is formed on the device dielectric layer. A channel opening is formed in the channel dielectric layer, and a barrier layer is deposited to line the channel opening. A conductor core is deposited to fill the channel opening. A barrier layer is deposited which contains an element capable of reacting during thermal treatment with both the conductor core and the channel dielectric layer to form a barrier to diffusion of the material of the conductor core to the channel dielectric layer. The barrier layer reacts with the conductor core and the channel dielectric layer to form a compound which provides a bond which blocks surface diffusion and permits conductor core to conductor core diffusion. This also allows the barrier layer deposition to be self-aligning in the channel opening.

The present invention provides an integrated circuit and method of manufacture which utilizes a material selected from a group consisting of zirconium (Zr), tantalum (Ta), titanium (Ti), tungsten (W), and combinations thereof in combination with low dielectric constant dielectric materials, which provide self-aligned barrier layers, increase conductivity in equally sized channels over the prior art, and provide comparable diffusion resistance at thinner barrier thicknesses than the prior art.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
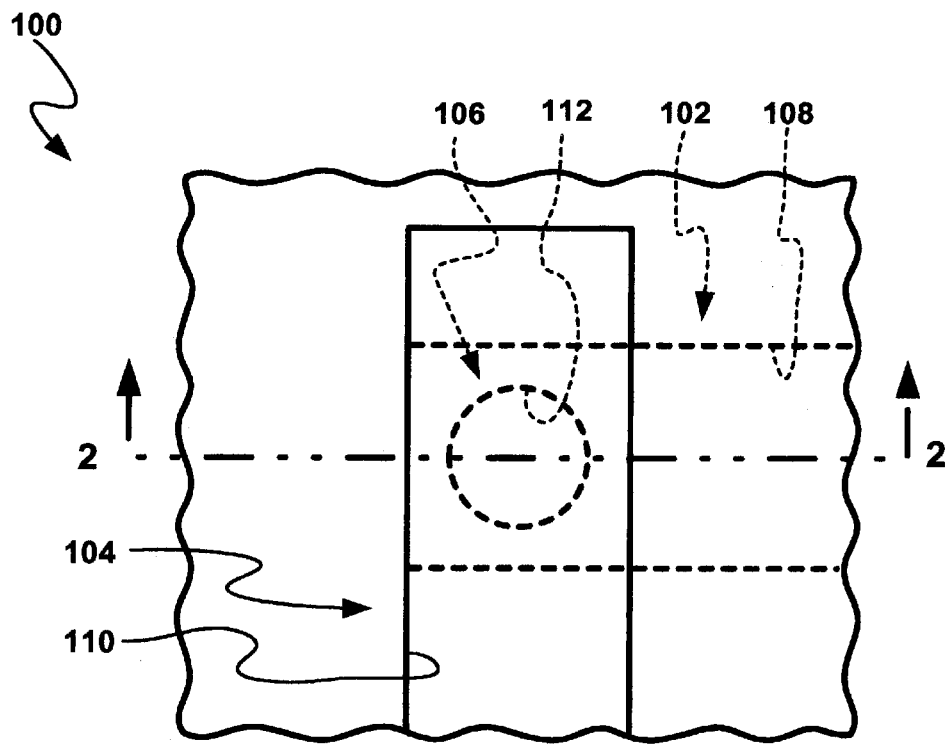
FIG. 1 (PRIOR ART) is a plan view of aligned channels with a connecting via.

Referring now to FIG. 1 (PRIOR ART), therein is shown a plan view of a semiconductor wafer 100 having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112. The dielectric layers herein can be of dielectric materials, such as silicon oxide, or low dielectric constant materials, such as benzocyclobutane (BCB), hydrogen silsesquioxane (HSQ), borophospho silicate glass (BPSG), etc.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
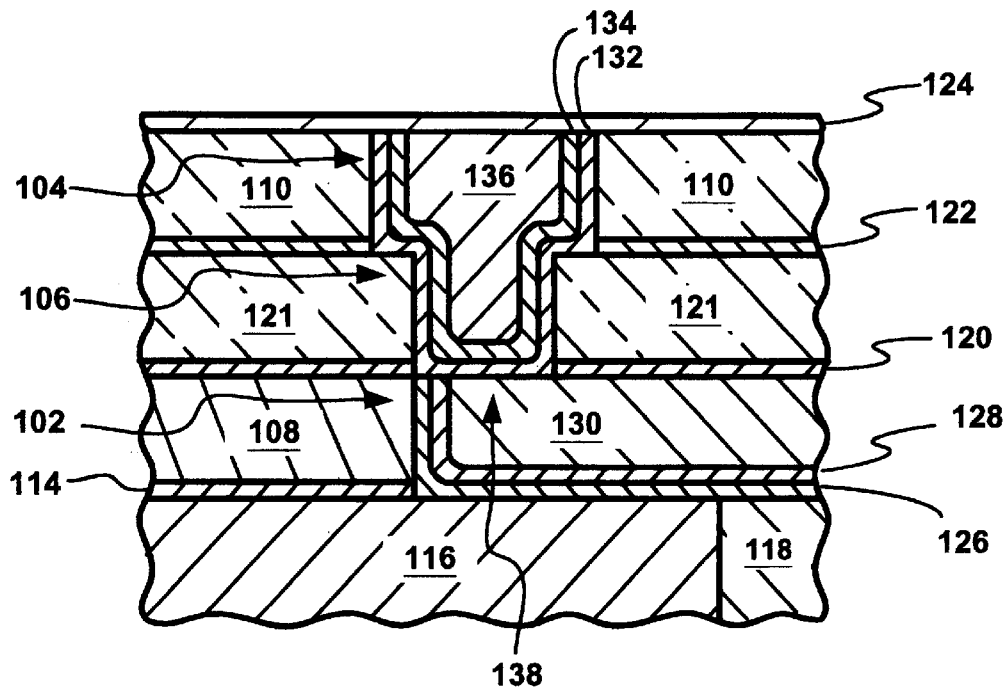
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts (not shown) are formed in the device dielectric layer 116 to connect to an operative semiconductor device (not shown). This is represented by the contact of the first channel 102 with a semiconductor device gate 118 embedded in the device dielectric layer 116. The various layers above the device dielectric layer 116 are sequentially: the first channel stop layer 114, the first channel dielectric layer 108, a via stop layer 120, the via dielectric layer 121, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor materials of the conductor cores 130 and 136 are deposited. The seed layers 128 and 134 are of substantially the same conductor material of the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum, titanium, tungsten, their nitrides, and combinations thereof are used as barrier materials to prevent diffusion. In addition to increasing the overall resistance of the semiconductor chip which contained all the semiconductor devices, the barrier region 138 would block diffusion of copper from the conductor core 130 to the conductor core 136 as electromigration caused the movement of copper atoms out of the via 106 and allowed the formation of voids therein. Further, the interface between the barrier materials and copper does not form a strong bond and creates weak points for electromigration to occur.

Thus, prior art combinations which included the various metal nitrides with copper were subject both to surface diffusion along the vias and channels and interface diffusion at the barrier region 138.

Figure 3:
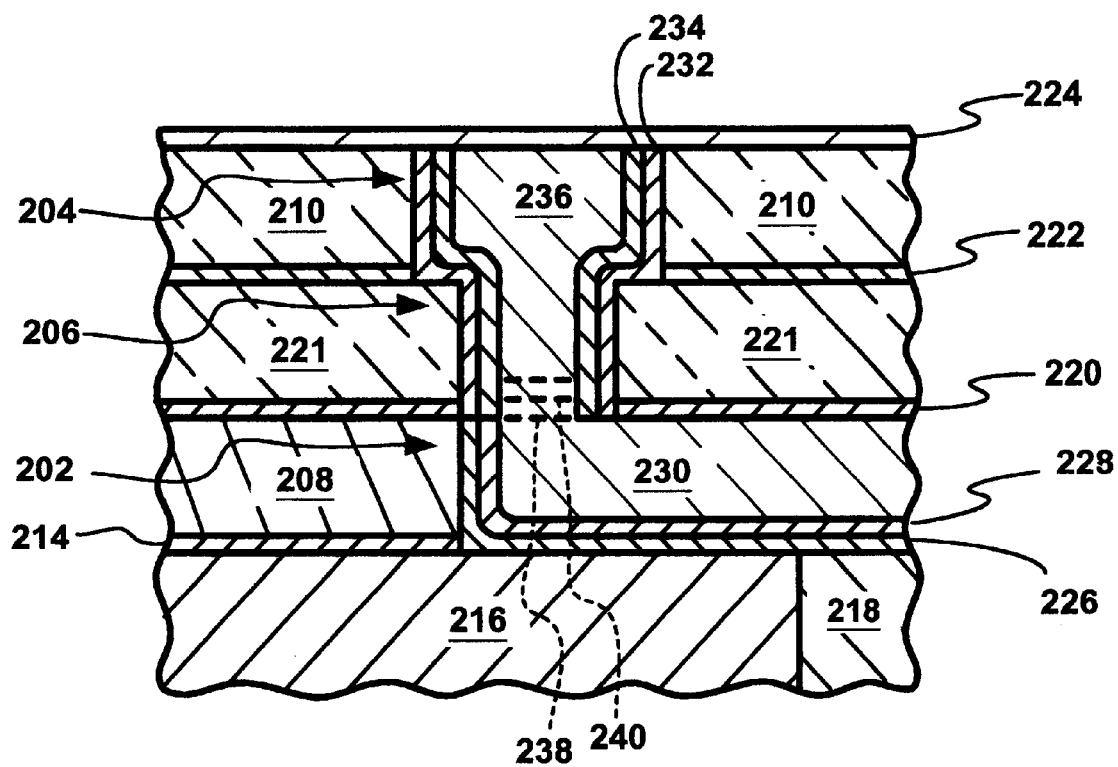
FIG. 3 is a cross-section similar to FIG. 2 (PRIOR ART) showing the channels and via according to the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second low dielectric constant (low-K) dielectric layers 208 and 210. The via 206 is a part of the second channel 204 and is disposed in a low-K via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel low-K dielectric layer 208, a via stop layer 220, the low-K via dielectric layer 221, a second channel stop layer 222, the second channel low-K dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor materials of the conductor cores 230 and 236 are deposited. The seed layers 228 and 234 are of substantially the same conductor material of the conductor cores 230 and 236 and become part of the respective conductor cores 230 and 236 after the deposition.

It will be noted the conductor cores 230 and 236 are integral in the present invention. As will hereinafter be explained, the barrier layer 232 forms a conductive intermetallic compound with the conductor material in a barrier material region 238. The seed layer 234 also is indistinguishable between the conductor cores 230 and 236 at a seed layer region 240.

In the present invention, a barrier material is used which capable of forming a carbide compound and alloying with the conductor core material, and a dielectric material is used which contains carbon. Fortunately, many low dielectric constant materials contain oxygen, nitrogen, silicon, and carbon.

Zirconium (Zr), for example, forms a carbide with the carbon in any silicon carbide (SiC)-based dielectric material, such as SiCOH, or any organic low-K dielectric material, and also a stable intermetallic compound with copper when heated. ZrC causes Zr to closely bond to the low-K dielectric material, which prevents copper diffusion into the low-K dielectric material. This preventative function is enhanced because zirconium has a higher atomic weight than copper to slow free movement of copper atoms through it. It further has the property of forming compounds with copper, which means it is reactive with Cu and forms a very good interface with copper because it is chemically similar. This property reduces surface diffusion.

Thus, when placed onto a via or a channel and heated to a temperature in the range from 100° C. to 450° C. for up to one hour, zirconium basically reacts with both the low-K dielectric material and the subsequently deposited copper to form a "coherent" bond, or a strong chemical bond, with both materials.

In the present invention, the barrier layers 226 and 232 may be formed by a number of different methods.

One method involves deposition of the metallic barrier material as a percentage of the initial deposition of conductor material on the low-K dielectric material, followed by deposition of the conductor material to form the intermetalllic compound. The deposition of the metallic barrier material will be to a thickness of between 10 Å to 100 Å. The semiconductor wafer 200 is then heated to around 100° C. to 450° C. for up to one hour. The thermal treatment causes the reaction:

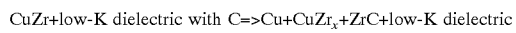
CuZr+low-K dielectric with C=>Cu+CuZr$_x$+ZrC+low-K dielectric

It is also possible to form other compounds during the above reaction, such as ZrSiO$_x$, ZrSiC, etc. along with the ZrC. The final metallic barrier material would be a mix of these compounds.

Another method involves deposition of the metallic barrier material as a pure metal followed by the conductor material and then the thermal treatment of the semiconductor wafer.

Various processes such as physical vapor deposition, chemical vapor deposition, and/or electroplating deposition may be used.

As would be evident to those skilled in the art, a number of advantages accrue from the present invention.

One advantage is that the barrier layers 226 and 232 are self-aligned in that the barrier compound of the barrier material (the metal carbide) only forms where it is in contact with the carbon containing low-K dielectric material. After the thermal treatment, the barrier metal forms discontinuous intermetallic compounds and, if is deposited as an alloy, the barrier metal can diffuse away. In either event, metallic barrier material is not formed solidly in the barrier region 238, so it does not block the diffusion of conductor material from the conductor core 230 to the conductor core 236. This helps prevent the formation of voids in the via 206.

Another advantage is that the barrier layers 226 and 232 can be very thin, under 100 Å, so the effective cross-sectional area of the via 206 is greater than for a conventional via which uses one of the high resistance materials.

Another advantage is that the coherent bonding forms strong chemical bonds which prevent surface diffusion of the conductor material.

In various embodiments, the barrier layers in addition to zirconium are of materials such as tantalum (Ta), titanium (Ti), tungsten (W), nitrides thereof, and combinations thereof. The seed layers are of materials such as copper (Cu), gold (Au), silver (Ag), alloys thereof and combinations thereof. The conductor cores with or without seed layers are of materials such as copper, aluminum (Al), gold, silver, alloys thereof, and combinations thereof. The dielectric layers are of low dielectric materials such as hydrogen silsesquioxane (HSQ), benzocyclobutene (BCB), etc. with dielectric constants below 3.0. The stop layers and capping layers (where used) are of materials such as silicon nitride (Si$_x$N$_x$) or silicon oxynitride (SiON).

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon,
   a carbon containing first dielectric layer formed over the semiconductor substrate having an opening provided therein;
   a conductor core filling the opening and connected to the semicondctor device; and
   a barrier layer lining the opening under the conductor core, the barrier layer of a carbide forming metal in an alloy with a conductor core metal and in a compound with carbon of the carbon containing first dielectric layer whereby the barrier layer is bonded by carbide formation with the carbon containing first dielectric layer, is alloyed to the material of the conductor core, and forms a barrier to diffusion of the material of the conductor core to the carbon containing first dielectric layer.

2. The integrated circuit as claimed in claim 1 wherein the barrier layer is a stable alloy coherently bonded with the material of the conductor core.

3. The integrated circuit as claimed in claim 1 wherein the barrier layer is a stable compound coherently bonded with the material of the carbon containing first dielectric layer.

4. The integrated circuit as claimed in claim 1 including:
   a carbon containing via dielectric layer formed over the carbon containing first dielectric layer and hang a via opening provided therein open to the conductor core;
   a carbon containing second dielectric layer formed over the via layer and having a second opening provided the open to the via opening;
   a second conductor core filling the via and second opt; and
   a second barrier layer lining the via and second openings under the second conductor core, the second barrier layer is of a material forming a barrier between the second conductor core and the carbon containing via and second dielectric layers and not forming a barrier between the conductor core and the second conductor core.

5. The integrated circuit as claimed in claim 1 wherein the barrier layer contains a material selected from a group consisting of zirconium, tantalum, titanium, tungsten, an alloy thereof and a combination thereof.

6. The integrated circuit as claimed in claim 1 wherein the carbon containing first dielectric layer is selected from a group consisting of a silicon carbide-based -dielectric material, an organic dielectric material, and a combination thereof.

7. The integrated circuit as claimed in claim 1 wherein the barrier layer contains a material selected from a group consisting of copper, aluminum, gold, silver, an alloy thereof, and a combination thereof.

8. An integrated circuit comprising:
   a semiconductor substrate having a semiconductor device provided thereon;
   a device dielectric layer formed on the semiconductor substrate;
   a carbon containing low dielectric constant channel dielectric layer formed on the device dielectric layer having a channel opening provided therein;
   a conductor core filling the channel opening and connected to the semiconductor device; and
   a barrier layer ling the channel opening under the conductor core, the barrier layer of a carbide forming metal in an alloy with a conductor core metal and in a compound with carbon of the carbon containing low dielectric constant channel dielectric layer whereby the barrier layer is coherently bonded with the carbon containing low dielectric constant channel dielectric layer. is alloyed to the material of the conductor core, and forms a barrier to diffusion of the material of the conductor core to the carbon containing low dielectric constant channel dielectric layer.

9. The integrated circuit as claimed in claim 8 wherein the barrier layer is a stable compound coherently bonded with the material of the conductor core and contains a material selected from a group consisting of zirconium, tantalum, titanium, tungsten, an alloy thereof and a combination thereof.

10. The integrated circuit as claimed in claim 8 wherein the barrier layer is a stable compound coherently bonded with the material of the carbon containing first dielectric layer, the barrier layer a metal selected from a group consisting of zirconium, tantalum, titanium, tungsten, an alloy thereof and a combination thereof, and the first dielectric layer is selected from a group consisting of a silicon carbide-based dielectric material, an organic dielectric material, and a combination thereof.

11. The integrated circuit as claimed in claim 8 including
   a carbon containing low dielectric constant via dielectric layer formed over the channel dielectric layer and having a via opening provided therein open to the conductor core;
   a carbon containing low dielectric constant second channel dielectric layer formed over the carbon containing low dielectric constant via layer and hag a second channel opening provided therein open to the via opening;
   a second conductor core filling the via and second channel openings; and.
   a second barrier layer lining the via and second channel openings under the second conductor core, the second barrier layer is of a material forming a barrier between the second conductor core and the carbon containing low dielectric constant via and second channel dielectric layers and not forming a barrier between the conductor core and the second conductor core.

12. The integrated circuit as claimed in claim 11 wherein the barrier layers contain materials selected from a group consisting of zirconium, tantalum, titanium, tungsten, an alloy thereof and a combination thereof.

13. The integrated circuit as claimed in claim 11 wherein the carbon containing channel dielectric layers are selected from a group consisting of a silicon carbide-based dielectric material, an organic dielectric material, and a combination thereof.

14. The integrated circuit as claimed in claim 11 wherein the conductor cores contain materials selected from a group consisting of copper, aluminum, gold, silver, an alloy thereof, and a combination thereof.

15. A method of manufacturing an integrated circuit comprising the steps of:
   providing a semiconductor substrate having a semiconductor device provided thereon;
   forming a carbon containing first dielectric layer formed over the semiconductor substrate;
   forming an opening in the first dielectric layer;
   depositing a barrier layer to line the opening;
   depositing a conductor core over the barrier layer to fill the opening and connect to the semiconductor device; and
   thermal treatment of the semiconductor substrate whereby the barrier layer is reacted with the first dielectric layer to form a metal carbide, is alloyed to the material of the conductor core, and forms a barrier to diffusion of the material of the conductor core to the first dielectric layer.

16. The method of manufacturing an integrated circuit as claimed in claim 15 wherein the step of thermal treatment uses a temperature from 100° C. to 450° C.

17. The method of manufacturing an integrated circuit as claimed in claim 15 wherein the step of depositing the barrier layer is performed with the initial deposition of the material of the conductor core.

18. The method of manufacturing an integrated circuit as claimed in claim 15 including:

depositing a carbon containing via dielectric layer over the dielectric layer;

depositing a carbon containing second dielectric layer over the via dielectric layer;

forming via and second openings respectively in the via and second dielectric layers;

depositing a second barrier layer to line the via and second openings, the second barrier layer is of a material forming a barrier between the second conductor core and the via and second dielectric layers; and depositing a second conductor core to fill the via and second openings before the thermal treatment of the semiconductor substrate whereby the second barrier layer is reacted with the via and second dielectric layers to form a metal carbide, is alloyed to the material of the second conductor core, forms a barrier to diffusion of the material of the second conductor core to the second dielectric layer, and does not form a barrier to diffusion between the first and second conductor cores after the thermal treatment of the semiconductor substrate.

19. The method of manufacturing an integrated circuit as claimed in claim 15 wherein the step of depositing the barrier layer is performed with a material selected from a group consisting of zirconium, tantalum, titanium, tungsten, an alloy thereof, and a combination thereof.

20. The method of manufacturing an integrated circuit as claimed in claim 15 wherein the step of depositing the dielectric layer is performed with a material selected from a group consisting of a silicon carbide-based dielectric material, an organic dielectric material, and a combination thereof.

21. The method of manufacturing an integrated circuit as claimed in claim 15 wherein the step of depositing the conductor core is performed with a material selected from a group consisting of copper, aluminum, gold, silver, an alloy thereof, and a combination thereof.

22. A method of manufacturing an integrated circuit comprising the steps of:

providing a semiconductor substrate having a semiconductor device provided thereon;

forming a device dielectric layer on the semiconductor substrate;

forming a carbon containing low dielectric constant channel dielectric layer on the device dielectric layer;

forming a channel opening in the channel dielectric layer;

depositing a barrier layer to line the channel opening; and thermal treatment of the semiconductor substrate whereby the barrier layer is reacted with the channel dielectric layer to form a metal carbide, is alloyed to the material of the conductor core, and forms a barrier to diffusion of the material of the conductor core to the channel dielectric layer.

23. The method of manufacturing an integrated circuit as claimed in claim 22 wherein the step of thermal treatment uses a temperature from 100° C. to 450° C. for up to one hour.

24. The method of manufacturing an integrated circuit as claimed in claim 22 including:

forming a carbon containing low dielectric constant via dielectric layer over the channel dielectric layer;

forming a carbon containing low dielectric constant second channel dielectric layer formed over the via dielectric layer;

forming a second channel and via openings respectively in the second channel and via dielectric layers;

depositing a second barrier layer to line the via and second channel openings, the second barrier layer is of a material forming a barrier between the second conductor core and the via and second channel dielectric layers;

depositing a second conductor core to fill the via and second channel openings before the thermal treatment of the semiconductor substrate whereby the second barrier layer is reacted with the via and second channel dielectric layers to form a metal carbide, is alloyed to the material of the second conductor core, forms a barrier to diffusion of the material of the second conductor core to the second channel and via dielectric layers, and does not form a barrier to diffusion between the first and second conductor cores after the thermal treatment of the semiconductor substrate.

25. The method of manufacturing an integrated circuit as claimed in claim 24 wherein the steps of depositing the barrier layers are performed with materials selected from a group consisting of zirconium, tantalum, titanium, tungsten, an alloy thereof, and a combination thereof.

26. The method of manufacturing an integrated circuit as claimed in claim 24 wherein the steps of depositing the low dielectric constant dielectric layers are performed with materials selected from a group consisting of a silicon carbide-based dielectric material, an organic dielectric material, and a combination thereof.

27. The method of manufacturing an integrated circuit as claimed in claim 24 wherein the steps of depositing the low dielectric constant dielectric layers are performed with materials selected from a group consisting of copper, aluminum, gold, silver, an alloy thereof, and a combination thereof.

* * * * *

UNITED STATES PATENT AND TRADEMARK OFFICE
CERTIFICATE OF CORRECTION

PATENT NO.      : 6,445,070 B1                                               Page 1 of 1
DATED           : September 3, 2002
INVENTOR(S)     : Wang et al.

It is certified that error appears in the above-identified patent and that said Letters Patent is hereby corrected as shown below:

<u>Title page,</u>
Item [57], ABSTRACT,
Line 1, delete "therefore" and insert -- therefor --.

<u>Column 1,</u>
Line 13, delete "Minl" and insert therefor -- Ming --.

<u>Column 7,</u>
Line 12, delete "hang" and insert therefor -- having --.
Line 15, delete "the" and insert therefor -- therein --.
Line 17, delete "opt" and insert therefor -- opening --.
Line 49, delete "ling" and insert therefor -- lining --.
Line 56, delete "layer." and insert therefor -- layer, --.

<u>Column 8,</u>
Line 16, delete "hag" and insert therefor -- having --.
Line 20, delete "and." and insert therefor -- and --.

Signed and Sealed this

Thirty-first Day of December, 2002

JAMES E. ROGAN
*Director of the United States Patent and Trademark Office*